United States Patent [19]
Bernstein et al.

[11] Patent Number: 5,999,037
[45] Date of Patent: Dec. 7, 1999

[54] CIRCUIT FOR OPERATING A CONTROL TRANSISTOR FROM A FUSIBLE LINK

[75] Inventors: Kerry Bernstein, Underhill, Vt.; Daniel C. Edelstein, New Rochelle, N.Y.; William A. Klaasen, Underhill; Wilbur D. Pricer, Charlotte, both of Vt.

[73] Assignee: International Business Machines Corporation, Armonk, N.Y.

[21] Appl. No.: 08/904,397

[22] Filed: Jul. 31, 1997

[51] Int. Cl.$^6$ ..................................................... G11C 7/00
[52] U.S. Cl. ...................................... 327/525; 365/225.7
[58] Field of Search ..................................... 327/525, 526; 365/96, 225.7; 326/39, 10, 14

[56] References Cited

U.S. PATENT DOCUMENTS

| | | | |
|---|---|---|---|
| 3,214,707 | 10/1965 | Wuerker | 331/128 |
| 4,412,241 | 10/1983 | Nelson | 357/51 |
| 4,587,588 | 5/1986 | Goldstein | 361/54 |
| 4,769,791 | 9/1988 | Liou et al. | 365/203 |
| 4,837,520 | 6/1989 | Golke et al. | 324/550 |
| 4,987,560 | 1/1991 | Hamano et al. | 365/200 |
| 5,153,458 | 10/1992 | Hinooka | 307/443 |
| 5,210,674 | 5/1993 | Yamaguchi et al. | 361/19 |
| 5,276,653 | 1/1994 | McKenny | 365/225.7 |
| 5,491,444 | 2/1996 | McClure | 327/525 |
| 5,539,703 | 7/1996 | Manning | 365/222 |
| 5,638,331 | 6/1997 | Cha et al. | 365/201 |

*Primary Examiner*—Terry D. Cunningham
*Assistant Examiner*—Eunja Adolphe
*Attorney, Agent, or Firm*—Pollock, Vande Sande & Amernick

[57] ABSTRACT

A circuit for enabling a controlled transistor in response to an ablated fusible link. The fusible link is configured so that no d.c. potential resides on the link once it has been ablated. A source of alternating voltage is capacitively coupled to the fusible link and maintains the fusible link from reconnection due to dendrite formation once it is ablated. An a.c. to d.c. voltage converter is used to signal the change in condition of the fusible link, thus, actuating a control transistor of a redundant circuit element in a replacement operation.

16 Claims, 4 Drawing Sheets

CIRCUIT FOR OPERATING A CONTROL TRANSISTOR FROM A FUSIBLE LINK

BACKGROUND OF THE INVENTION

The present invention relates to electronic circuits which have fusible links. Specifically, a circuit is described which enables a redundant circuit element in response to the ablation of a fusible link, and which inhibits dendritic growth on an ablated fusible link avoiding reconnection of the link.

Integrated circuit technology such as high density memories, including static random access memories and dynamic random access memories have many storage locations. High density integrated circuits are fabricated as an individual component where the entire device relies upon every circuit element. The entire memory may have to be discarded in the event of a failure to read or write to any storage location as a result of a single malfunctioning circuit element.

As a result of this consequence many semiconductor memories, as well as other circuits, are fabricated with redundant circuit elements. In the event of a failure of a circuit element, the redundant element may be substituted for the failed element. The redundant elements are enabled by ablating a fusible link which disables the failed component, and at the same time, activates the spare device. The process of ablating the fusible links is accomplished using a laser beam ablating the fusible link.

In other applications, fusible links are utilized to customize the chip function after manufacture. They may be used to customize the operations of a general purpose microcontroller, or to specify a determined optimal operating supply voltage. The fusible links may be used to provide an identification number for a circuit device to thwart theft or for secure communication from arrays for lookup tables.

Fusible links are extensively used in analog applications to trim the value of precision components, such as a capacitor or resistor, or to reduce the offset in amplifiers and comparators, as well as to finely trim component values of connected subassemblies to match output-input characteristics of the connected subassemblies.

The process of activating a redundant circuit element begins when the fusible link is ablated or "blown". Ablation is effected by laser radiation of the fusible link thereby vaporizing the link, or by forcing an excessive current through a very small diameter fusible link which heats to a temperature high enough to vaporize the link. The process of ablating a fusible link results in rupture of the dielectric encapsulation used on the integrated circuit and a portion of the metal material escapes as a vapor. The rupture in the dielectric passivation exposes the metal to unwanted chemical reactions. The ablation may also have another unfortunate consequence of rupturing any anticorrosive encapsulation material which may also be around the fusible link.

The fusible links are usually contained in the top most metal layer of the integrated circuit to provide easy access for laser ablation, and to permit the vaporized metallic material created during the ablation process to escape. In the past, the fusible links were typically aluminum, and when the fusible link is ablated or "blown", an oxide forms around the free ends of the fusible link largely self passivating the link against corrosion. In the future, however, integrated circuits will use other types of metal wiring, such as copper, which if implemented as a fusible link, will not produce a self passivating oxide. The free copper ends of a blown fusible link are subject to dendritic growth, which can reconnect the ends of a blown fusible link with a low enough resistance to reactivate the defective circuit component. The formation of dendritic growth on the ends of a conductor of a blown fuse is enhanced by the presence of a d.c. potential across the ends, as well as temperature and humidity. The exposed ends of a copper fusible link are also subject to corrosion which can proceed from the ruptured site and follow the wire material of the fusible link to a circuit junction where it may interrupt a conductive structure in the circuit wiring. Before integrated circuits may be implemented with metals other than aluminum, such as copper which are not self passivating, a solution to the forgoing problem is necessary.

SUMMARY OF THE INVENTION

It is an object of this invention to provide a circuit which minimizes the potential for dendritic growth on the ends of a blown fusible link conductor.

It is another object of the invention to prevent corrosion from proceeding from the ends of a blown fusible link.

It is a more specific object of this invention to provide a circuit which operates in response to a fusible link ablation to implement a redundant circuit element and which prevents dendritic growth on the ends of a blown fusible link conductor.

These and other objects of the invention are provided by a circuit which enables a control transistor for implementing a redundant circuit element in response to an ablated fusible link. The circuit insures that no d.c. voltage remains across a blown fusible link which would otherwise enhance the growth of dendrites from the free ends of the blown fusible link.

In a preferred embodiment of the invention, a source of alternating voltage is capacitively coupled across the fusible link. The a.c. voltage may be derived from the system clock signal, which is usually available at multiple locations within any integrated circuit or the a.c. signal may come from any other convenient source. The a.c. signal is applied across the fusible link. Dendritic growth is accelerated by ionized copper atoms responding to a d.c. field. An a.c. field does not supply a driving force to promote dendritic growth. Thus, the a.c. signal does not contribute to dendrite growth when the link is blown. As long as the fusible link remains intact, the a.c. voltage across the fusible link is very small. A circuit capable of sensing the a.c. voltage across the fusible link provides a change in logic output upon a change of a.c. voltage detected across the fusible link. Thus, when the link is blown during the ablation process, the current through the fusible link is interrupted and the a.c. voltage across the link increases to a significantly larger value. This can be used to produce a logic level which operates a control transistor. The control transistor might typically replace the defective circuit element with a redundant circuit element. The a.c. voltage which remains across the blown fusible link does not stimulate the growth of dendrites on the free ends of the conductor.

In yet another embodiment of the invention, the fusible link is capacitively coupled to an oscillator circuit and maintained free of any d.c. voltage. The coupling is such that the oscillator oscillates when the fusible link is intact. Once the fusible link is blown, current through the link is interrupted and the oscillations cease. The non-oscillating condition is detected as the signal for enabling the control transistor to replace a defective circuit element with a redundant circuit element.

DESCRIPTION OF THE PREFERRED EMBODIMENT

Figure 1:
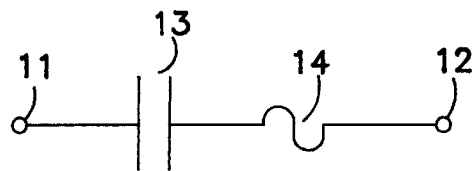
FIG. 1 illustrates a fusible link in the unablated state connected to a capacitor.
Figure 2:
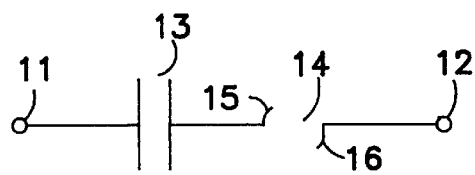
FIG. 2 illustrates a fusible link in the ablated state connected to a capacitor.

FIG. 1 and 2 illustrate a fusible link 14 in the unablated condition (FIG. 1) and ablated condition (FIG. 2). The fusible links 14 have been capacitively coupled to a terminal 11. Thus, in the case of an ablated fusible link 14 of FIG. 2, no d.c. voltage is applied to the fusible link ends 15, 16. If the ends 15, 16 of the ablated conductor constituting the fusible link 14 can be maintained free of any d.c. electric potential, the likelihood of dendrites forming on the ends 15, 16 is greatly diminished. The detection of ablation of the fusible link can be accomplished by monitoring the a.c. current through fusible link 14, or alternatively, monitoring the a.c. voltage across the fusible link 14.

Figure 3A:
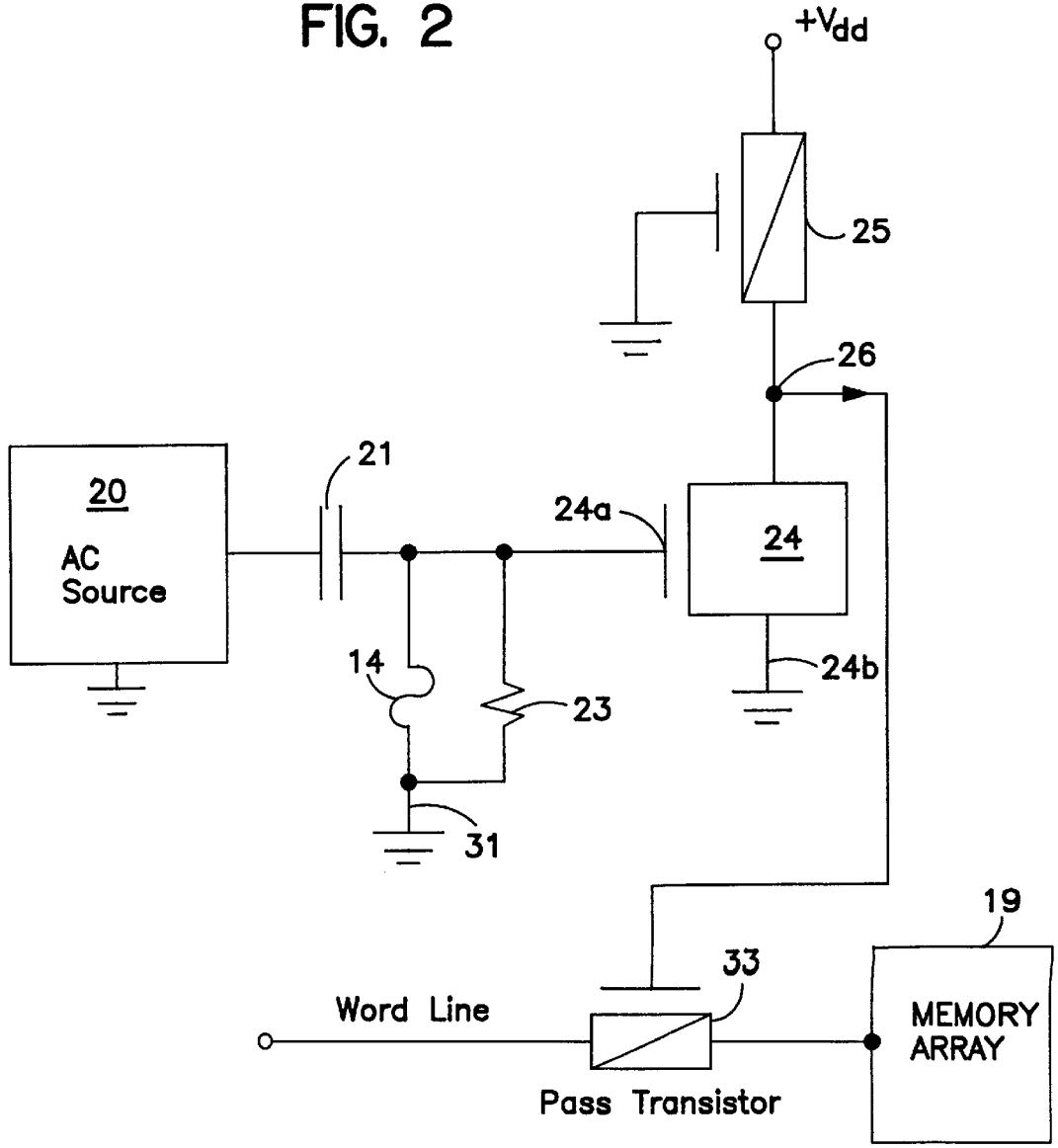
FIG. 3A illustrates a first embodiment of the invention for providing a circuit which operates a control transistor in response to the ablation of a fusible link.
Figure 4:
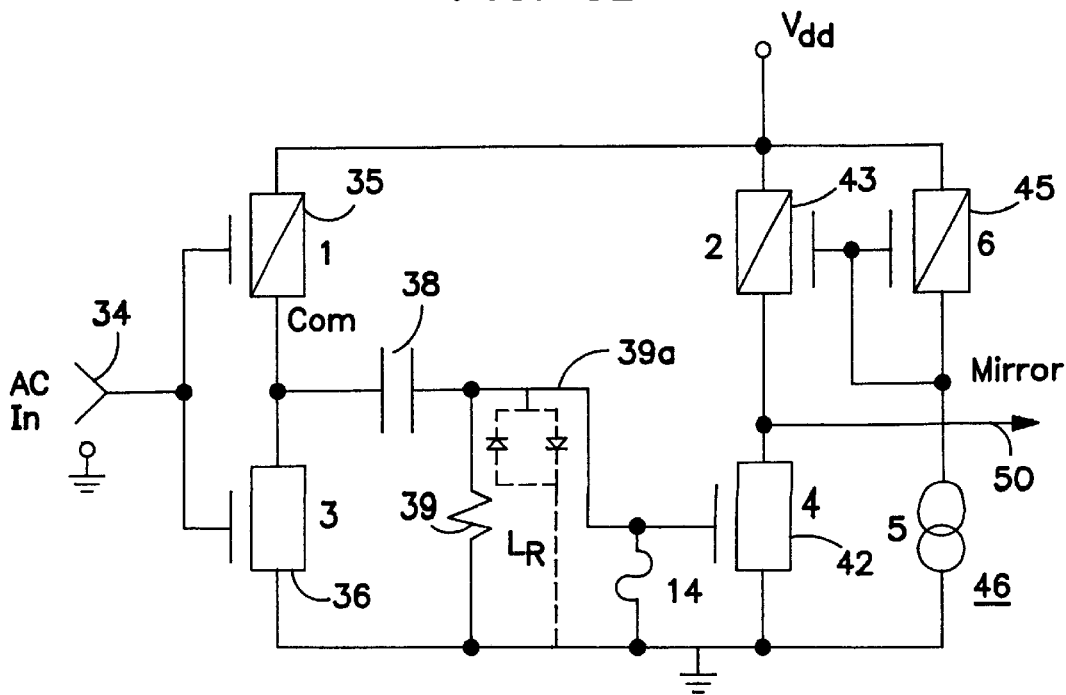
FIG. 4 is an illustration of another embodiment of the invention which operates a control transistor in response to the ablation of a fusible link.

FIG. 3A illustrates a circuit which is capable of detecting the interruption of a.c. current through fusible link 14 and the resultant increase in a.c. voltage across the terminals of fusible link 14. There is no d.c. voltage across the terminals of fusible link 14 to promote growth of dendrites. In this example, a spare wordline of a memory 19 is activated by ablating the fusible link 14 thereby activating a row of transistors to replace another row of transistors which contains a defective transistor. A pass transistor 33 is enabled by an inverter circuit which operates in response to the ablation of fusible link 14 to activate the redundant wordline. The fusible link 14 is coupled by capacitor 21 to a source 20 of the a.c. signal which may be a system clock signal or other suitable source. The parallel combination of fusible link 14 and leakage reactance 23 is connected across a gate 24a and the source 24b of an NMOS transistor 24. NMOS transistor 24 and PMOS transistor 25 provide an asymmetric inverter, which as will be evident from the discussion of FIG. 4, provides a low logic level output 26 when the peak value of the a.c. voltage across fusible link 14 exceeds the threshold value for NMOS transistor 24.

When the fusible link 14 is ablated by a laser beam, or an equivalent process, the a.c. voltage across the fusible link 14 increases significantly and the a.c. current through fusible link 14 drops to zero. The inverter circuit comprising NMOS transistor 24 and PMOS transistor 25 is asymmetric in that the N channel transistor is capable of sinking more current than the P channel transistor can source. The a.c. voltage during the positive portion of its cycle will turn NMOS transistor 24 on, however, during the negative going portion of the a.c. cycle, PMOS transistor 25 cannot pass enough pull up current to raise the output logic level back to Vdd.

The effect of this process is to make the inverter circuit comprising NMOS transistor 24 and PMOS transistor 25 an a.c. to d.c. converter. When the fusible link 14 is ablated or "blown", a logic signal is generated at junction 26 and the pass transistor 33 of the replacement wordline is enabled.

Figure 3B:
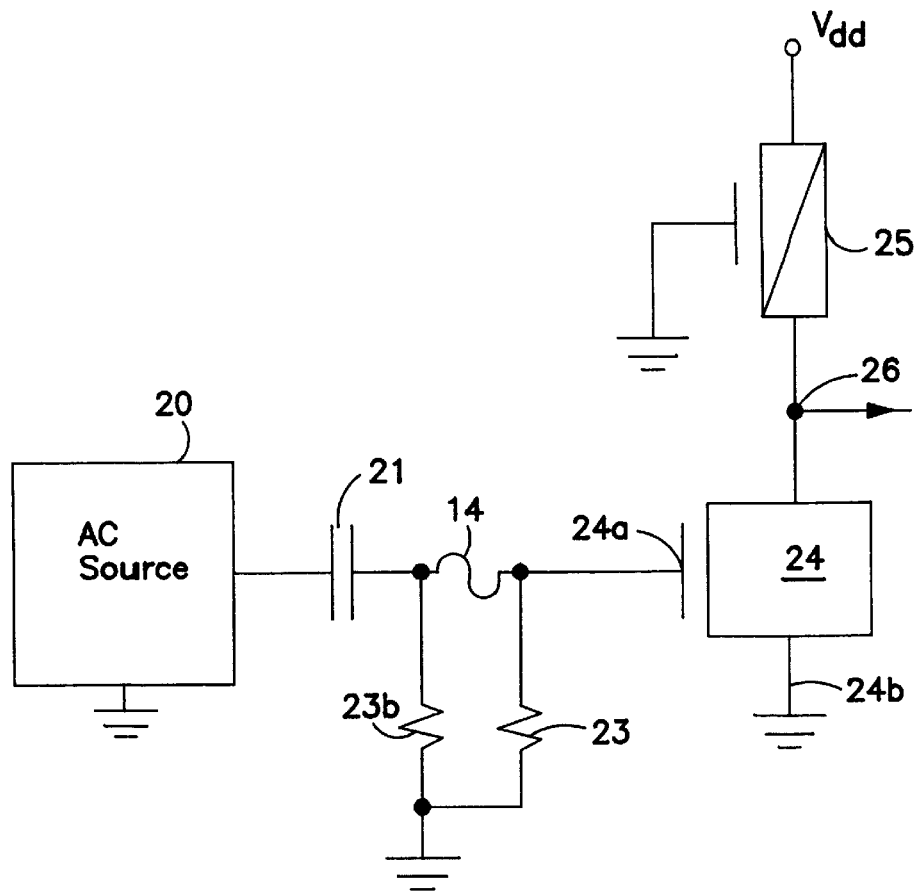
FIG. 3B illustrates an alternative arrangement of the fusible link and the capacitor from that shown in FIG. 3A.

FIG. 3B illustrates an equivalent circuit of FIG. 3A, where the fusible link is serially connected with the gate 24a of NMOS transistor 24, and a second leakage reactance 23b is placed on the input side of the fusible link 14. In this alternative circuit, ablation of the fuse results in the output of the device at junction 26 going to a logic high state.

Figure 6:
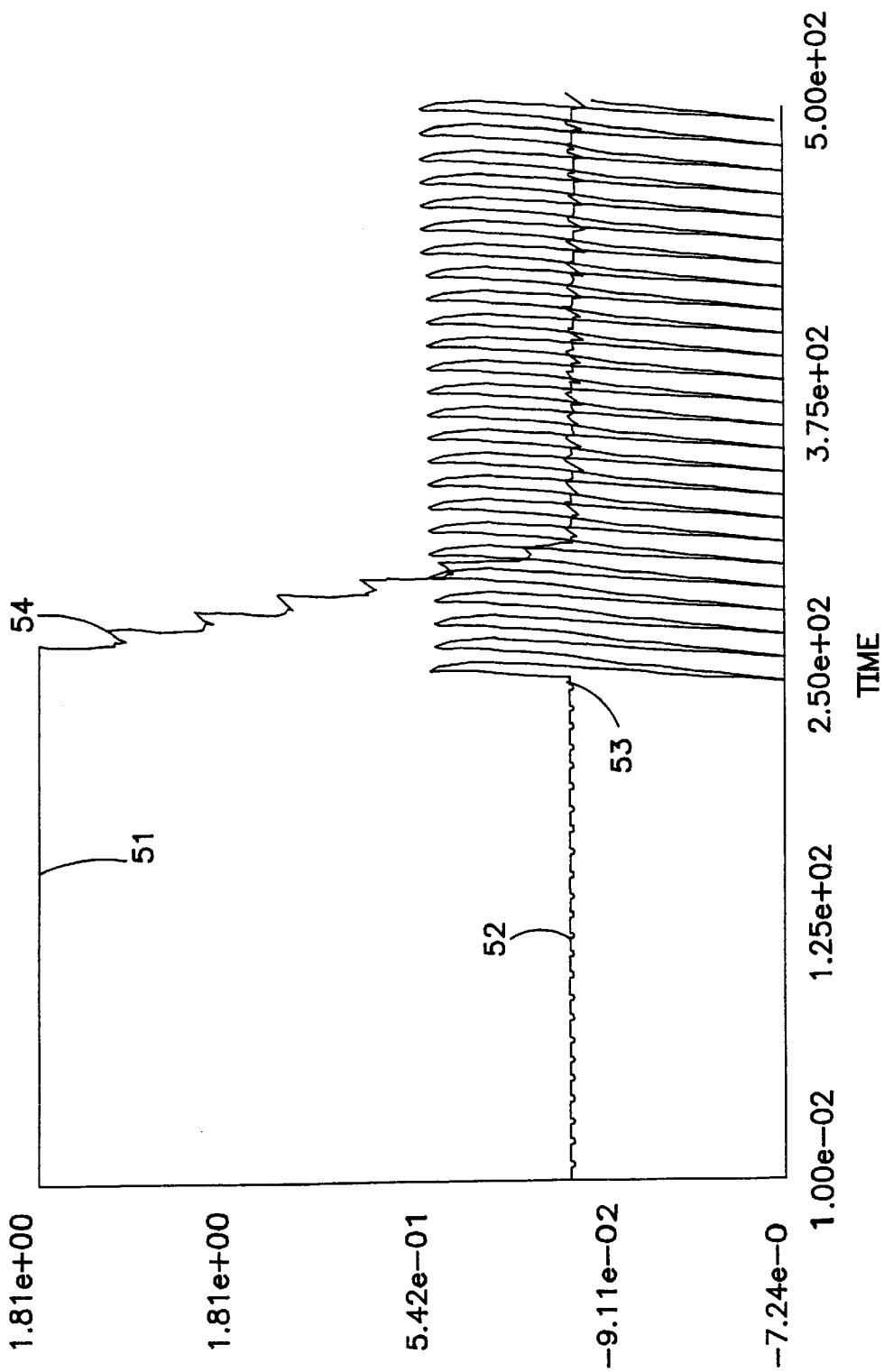
FIG. 6 illustrates the simulated response for the circuit of FIG. 4 when the fusible link is ablated.

Referring now to FIG. 4 there is shown an embodiment of the invention which was computer simulated having a response which appears as FIG. 6. The circuit includes an a.c. signal input 34 which is connected to an inverter circuit comprising PMOS transistor 35 and NMOS transistor 36. The inverter circuit provides for current gain of the a.c. signal, such as a clock signal, which is applied to the remaining portion of the circuit. The fusible link 14 is connected across the source of the a.c. signal by capacitor 38, and a very small amount of a.c. signal is therefore applied to the gate of NMOS transistor 42. A leakage reactance 39 assures that no significant charge can build up on fusible link 14 to provide any d.c. voltage which would tend to enhance dendrite formation. The leakage reactance 39 may be a resistor or two serial or parallel back to back diodes 39(a) to provide a leakage path across the fusible link 14. The back to back diodes would prevent the leakage element reactance 39 from acting like a single diode, partially rectifying the a.c. signal and thereby supplying some small d.c. voltage across the ends of the blown fusible link 14.

NMOS transistor 42 is the input transistor to an inverter circuit having pull up PMOS transistor 43. A weak current source 46 is provided to the current mirror formed by transistors 43 and 45, which provides a pull up current to raise the voltage on line 50 when there is no a.c. signal to the gate of transistor 42. Prior to the ablation of fusible link 14, NMOS transistor 42 is essentially turned off, and line 50 resides at a high logic level. When the fusible link 14 is ablated or "blown", the NMOS transistor 42 is alternatively enabled to the on condition by the a.c. voltage. With the ablation of fusible link 14, current through the fusible link is interrupted and the magnitude of the a.c. voltage appearing at the gate of NMOS transistor 42 has increased in magnitude several fold, and the transistor 42 during the positive going peaks of the a.c. signal is rendered into the on condition. However, the negative peaks of the a.c. voltage are not sufficiently long for the weak current source 46 (second current mirror 43, 45) to return line 50 to the off state.

FIG. 6 demonstrates the inverter output voltage when the fusible link 14 goes from the intact condition to the ablated condition. 52 illustrates the a.c. voltage across the fusible link 14, and 51 illustrates the inverter output voltage 50. Prior to ablation of the fusible link 14, only a very low a.c. voltage level is applied to the gate of NMOS transistor 42 due to the unablated fusible link 14. At the time of ablation, shown as 53 on FIG. 6, the magnitude of a.c. voltage increases significantly across the fusible link 14 and between the gate and source of NMOS transistor 42. The inverter output signal 51 trends downward due to each positive peak of the input voltage to the inverter circuit. As can be seen, the pull up current is ineffective and only partially pulls up the output voltage 54 during the negative portion of the a.c. signal waveform. Thus, the value of the output signal for the inverter continues downward until it reaches a logic zero level.

The logic zero might be coupled to the control transistor of a redundant circuit which is enabled into conduction, and at the same time, an a.c. signal is maintained across the fusible link 14 which does not promote dendrite formation on the ablated ends of the conductor for the fusible link 14.

The foregoing embodiments therefore provide a d.c.-voltage-free condition across the ablated fusible link 14, while maintaining an a.c. voltage across the ablated fusible link which does not promote the formation of dendrites.

Figure 5:
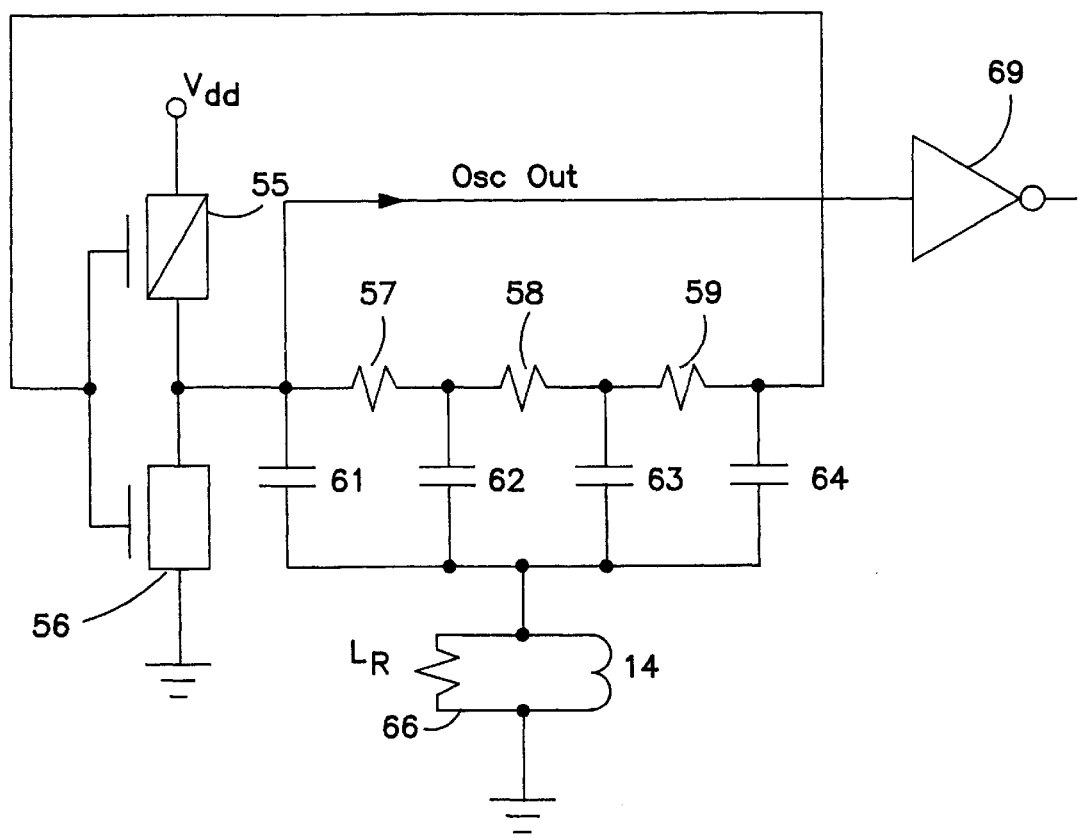
FIG. 5 is another embodiment of the invention having an oscillator capacitively coupled to a fusible link for operating a control transistor.

An alternative solution for providing a d.c. voltage free condition on an ablated fusible link 14 is shown in FIG. 5. FIG. 5 illustrates a phase shift oscillator including an inverter circuit comprising NMOS transistor 56 and PMOS transistor 55. A lattice feedback network comprising resistors 57, 58 and 59 and capacitors 61, 62, 63 and 64 provide a feedback voltage having the proper phase shift for making the inverter circuit oscillate. The fusible link 14 connects the feedback network to a common connection of the oscillator. The leakage reactance 66 removes any residual d.c. electrostatic charge which might accumulate across the ends of the ablated fusible link 14.

Prior to ablation of the fusible link 14, the circuit oscillates due to the four poles presented by the feedback network. Once ablation of the fusible link 14 occurs, the feedback network then resembles a simple network zero which will not provide adequate phase shift to maintain oscillation. In this condition, the ablated fusible link 14 receives no d.c. voltage as it is capacitively coupled to the feedback network. Thus, it is possible, using the oscillator circuit of FIG. 5, to detect an ablated fusible link 14 when oscillations cease. This embodiment allows neither d.c. or a.c. voltage across the ends of a blown fusible link. An a.c. to d.c. converter circuit 69, similar to the ones described with FIGS. 3 and 4, can be used to provide a logic one condition when oscillations cease.

Thus, there has been described with respect to several embodiments a method and technique for avoiding formation of dendrites on a blown fusible link, while providing a control function responsive to the state of the fusible link. Those skilled in the art will recognize yet other embodiments of the invention described by the claims which follow.

What is claimed is:

1. A circuit for operating a control transistor from a fusible link comprising:

a capacitor connecting an alternating voltage to said fusible link;

means for generating a control signal for said control transistor when the current through said fusible link is interrupted.

2. The circuit according to claim 1 wherein said means for generating a control signal is an asymmetric inverter circuit which changes from one logic state to another logic state when said current through said fusible link is interrupted.

3. A circuit for operating a control transistor from a fusible link comprising:

means for applying an a.c. voltage with substantially no d.c. component across said fusible link which prevents said fusible link from reconnecting when current through said fusible link is interrupted; and means for providing a logic signal which operates said control transistor, responsive to a change in a.c. voltage across said fusible link which follows an ablation of said fusible link.

4. The circuit for operating a control transistor according to claim 3 wherein said means for applying said a.c. voltage is a source of clock signals capacitively coupled to said fusible link.

5. The circuit for operating a control transistor according to claim 4 wherein said means responsive to a change in a.c. voltage is an asymmetrical inverter.

6. A circuit for enabling a control transistor in response to an interruption of current through fusible link comprising:

a source of alternating voltage capacitively coupled across said fusible link;

a leakage reactance connected across said fusible link; and an a.c./d.c voltage converter having an input connected to one side of said fusible link, wherein an input voltage to said a.c/d.c voltage converter changes when current through said fusible link is interrupted, and in response thereto, said a.c./d.c voltage converter provides a control voltage for enabling said control transistor.

7. The circuit according to claim 6 wherein said a.c./d.c voltage converter is an inverter circuit which is configured to provide an asymmetric response to an a.c. input voltage.

8. The circuit according to claim 6 wherein said source of alternating voltage is a clock generator.

9. The circuit according to claim 7 wherein said inverter has a pull up current insufficient to change the state of said inverter when an alternating voltage is supplied to said inverter input.

10. The circuit according to claim 6 wherein said leakage reactance comprises two back to back diodes.

11. A circuit for operating a control transistor comprising:

an oscillator circuit capacitively connected to a fusible link which oscillates only when said fusible link is conducting a current; and means for detecting when said oscillator ceases to oscillate whereby an interruption of current through a fusible link is detected for operating said control transistor.

12. The circuit according to claim 11 wherein said oscillator circuit has a feed back network capacitively connected through said fusible link to a common connection.

13. The circuit according to claim 12 wherein said fusible link connects delay elements of said feed back network to said common connection, and when current through said fusible link is interrupted, said delay elements are effectively disconnected from said feedback network.

14. A circuit for operating a control transistor comprising:

a fusible link;

circuit means for providing a logic signal to said control transistor responsive to the interruption of said fusible link, said circuit means including means for maintaining said fusible link substantially free of any d.c. voltage once said fusible link is interrupted.

15. The circuit of claim 14 wherein said circuit means is responsive to an interruption of an a.c. current flowing through said fusible link.

16. The circuit of claim 14 wherein said circuit means provides an a.c. voltage across the fusible link once said fusible link is blown.

* * * * *